US012080833B1

(12) United States Patent
Amini (10) Patent No.: US 12,080,833 B1
(45) Date of Patent: *Sep. 3, 2024

(54) LIGHTING SYSTEM FOR LED PANELS

(71) Applicant: Bejan E. Amini, Redondo Beach, CA (US)

(72) Inventor: Bejan E. Amini, Redondo Beach, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/474,100

(22) Filed: Sep. 25, 2023

Related U.S. Application Data (63) Continuation-in-part of application No. 17/584,144, filed on Jan. 25, 2022, now Pat. No. 11,769,759.

(60) Provisional application No. 63/201,551, filed on May 4, 2021.

(51) Int. Cl.
| | |
|---|---|
| G06F 3/14 | (2006.01) |
| G02B 27/00 | (2006.01) |
| H01L 33/48 | (2010.01) |
| H01L 33/50 | (2010.01) |
| H01L 33/62 | (2010.01) |

(52) U.S. Cl.
CPC ........ H01L 33/486 (2013.01); G02B 27/0012 (2013.01); H01L 33/507 (2013.01); H01L 33/62 (2013.01); *H01L 2933/0033* (2013.01)

(58) Field of Classification Search
CPC .......... G09F 9/33; G09F 9/301; G09F 9/3026; H01R 12/77; H01R 13/6205; G06F 3/1446; H01L 33/62; H01L 25/0753
See application file for complete search history.

(56) References Cited

U.S. PATENT DOCUMENTS

| | | | |
|---|---|---|---|
| 8,824,124 B1* | 9/2014 | Carlson | G09F 9/3026 40/624 |
| 9,536,457 B2* | 1/2017 | Cox | G09F 7/18 |
| 2016/0224306 A1* | 8/2016 | Rycyna, III | G09G 3/32 |
| 2020/0035134 A1* | 1/2020 | Pahlevaninezhad | G09F 9/3026 |

* cited by examiner

*Primary Examiner* — Elmito Breval
(74) *Attorney, Agent, or Firm* — QuickPatents; Kevin Prince (57) ABSTRACT

A lighting system for mounting on a mounting surface includes one or more mounting devices for mounting one or more illumination devices and wiring harnesses. A substantially flat platform includes a front side, a rear side, and three or more peripheral edges. The platform has a plurality of apertures therethrough for mounting the illumination devices thereto with mechanical fasteners. Two or more standoffs are each formed preferably at the peripheral edges of the platform, forming a gap between the mounting surface and the rear side of each illumination device to direct heat upwardly away from the illumination devices. As such, the illumination devices are mounted to the platform with mechanical fasteners, the wiring harnesses are used to connect each illumination device to at least one other illumination device and/or the power source, and the platform is mounted to the mounting surface with mechanical fasteners at each standoff.

18 Claims, 12 Drawing Sheets

LIGHTING SYSTEM FOR LED PANELS

CROSS-REFERENCE TO RELATED APPLICATIONS

This application is a Continuation-in-Part of U.S. application Ser. No. 17/584,144, filed on Jan. 25, 2022, which itself claimed the benefit of U.S. Provisional Patent Application 63/201,551, filed on May 4, 2021, both being incorporated herein by reference.

STATEMENT REGARDING FEDERALLY SPONSORED RESEARCH AND DEVELOPMENT

Not Applicable.

FIELD OF THE INVENTION

This invention relates to LED lighting panels, and more particularly to a device for mounting LED lighting panels on a mounting surface or encapsulated on a mounting surface.

BACKGROUND

Currently, there are a number of methods for modular light source illumination. Some of these methods attempt to provide a scalable, planar solution for illumination of materials, but these solutions fail to meet the needs of the industry because installation is complicated, does not provide for simple wire/cable management, and/or do not provide a heat sink, a thermal exhaust channel, a wire chase, frontal standoffs, or water-tight encapsulation. Other solutions provide only a way to attach the light source, such as an illumination device, to a substrate, but these solutions are similarly unable to meet the needs of the industry because they have not addressed the actual need for wire management, simplicity of installation and thermal loading of the light sources. Still, other solutions seek to interconnect electrically, but these solutions also fail to meet industry needs because they do not interconnect mechanically as well with a simple solution for wire/cable management. Further, they do not provide additional management for heat dissipation and exhaust. Also, the prior art does not provide for deflecting a frontal illuminated surface's flexure, sagging or mounting of the material being illuminated, typically being a translucent material. The present invention accomplishes these objectives.

SUMMARY OF THE INVENTION

The present device is a lighting system for mounting surface, such as a wall. One or more mounting devices secure one or more illumination devices, such as LED panels or sheets, and wiring harnesses, to the mounting surface. The mounting device may be used with adjacent such mounting devices to form an array of illumination devices, the illumination devices all interconnected with the wiring harnesses and a power source. The wiring harnesses may be simple wires with or without connectors, or a plurality of wires with or without connectors, or even a single wire.

A substantially flat platform includes a front side, a rear side, and three or more peripheral edges. The platform has a plurality of apertures therethrough for mounting the illumination devices thereto with mechanical fasteners, such as plastic clips, screws, adhesives, or the like. The apertures also allow the wiring harnesses to connect between adjacent illumination devices, and to traverse from the rear side of the platform to the front side of the platform if desired.

Two or more standoffs are each formed at the peripheral edges of the platform. In embodiments wherein the platform is made from a flat metallic sheet material, the standoffs may each be formed from the flat metallic sheet material and bent substantially 90-degrees twice to form a standoff leg and a standoff foot. In embodiments wherein the flat platform is made from a molded plastic material, the standoffs can be formed integrally with the platform, or the standoffs can each be a separate piece that provides a standoff function.

The standoffs form a gap or channel between the mounting surface and the rear side of each platform that holds one of the illumination device or devices. As such, heat from the illumination devices is able to travel upwardly behind the rear side of the platform to exit at a top of an illumination device display. In the case wherein the platform is made of the flat metallic sheet material, the platform further acts to dissipate heat from the illumination devices and throughout the platform.

The standoff leg preferably includes a mounting aperture therethrough that is aligned with a corresponding larger tool apertures formed in the flat platform proximate the standoff. A mechanical fastener, such as a drywall screw or the like, traverses the tool aperture of each standoff foot to traverse the mounting aperture with which the tool aperture is aligned. When the standoff foot is brought into contact with the mounting surface, the mechanical fastener is inserted through the tool aperture and through the mounting aperture to screw the mounting device to the mounting surface.

The lighting system includes a plurality of front standoffs, each projecting forward of the platforms. A diffusion material, such as a frosted acrylic panel, is disposed in front of the front standoffs to diffuse the light from the illumination devices. Each front standoff is formed so to refract and/or diffract and transmit light through and around the front standoff to reduce shadows of the front standoff and further integrate light in a space between the LED panels and the diffusion material.

As such, the illumination devices are mounted to the platform with mechanical fasteners and the wiring harnesses are used to connect each illumination device to at least one other illumination device and/or the power source. The platform is mounted to the mounting surface with the mechanical fasteners or other fastening means at one or more of the standoff feet.

In some embodiments, the platform is adapted to connect each illumination device with the wiring harnesses at the rear side of the platform. As such, for each illumination device at least one of the apertures is designated a connector aperture and sized to receive therethrough one or more connectors of the illumination devices. In the case where the connectors of the illumination devices are offset and parallel with a rear side of the illumination devices, the connector aperture is sized to allow the connectors of the illumination devices to clear the connector aperture to allowing the wiring harnesses to be connected with the connectors of the illumination devices. In alternate embodiments, the platform is adapted to connect each illumination device with the wiring harnesses at the front side of the platform. In some embodiments, each standoff is adapted to be mechanically fastened to a standoff of an adjacent mounting device.

In some embodiments adapted for humid or wet environments, the front side of the flat platform includes a gasket recess defining an internal area of the front side of the flat platform that is devoid of the apertures. A gasket is configured for retainment within eh gasket recess of the flat platform. Alternately the gasket is configured for contacting the front side of the flat platform that does not have a gasket recess. A non-opaque lens has an open rear end configured for receiving the illumination device therein and for mounting to the gasket and the flat platform with the mechanical fasteners. Side edges of the lens preferably have one or more ports through which the wiring harness traverses to form a liquid tight seal. Alternately the wiring harness traversed the platform to form the liquid tight seal. The non-opaque lens, the gasket, and the platform form a second liquid tight seal. The wiring harnesses of two adjacent illumination devices, in such embodiments, are connected at a third water tight seal, as is known in the art. As such, liquid is inhibited from contacting any conductors of the wiring harness or of the illumination device.

The present invention is a mounting device for simplified mounting of illumination devices onto a wall or other flat surface. The present device facilitates cable and wire management, heat dissipation away from the illumination devices through providing a channel or gap between the illumination devices and the wall, as well as heat dissipation through the mounting device itself. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Illustrative embodiments of the invention are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list. When the word "each" is used to refer to an element that was previously introduced as being at least one in number, the word "each" does not necessarily imply a plurality of the elements, but can also mean a singular element.

FIGS. 1-4 and 11 illustrate a lighting system 11 that comprises one or more mounting devices 10 for mounting one or more illumination devices 20, such as LED panels with LEDs 25, and wiring harnesses 30 (FIG. 4) on a mounting surface 15, such as a wall. Each mounting device 10 may be used with adjacent such mounting devices 10 to form an array of illumination devices 20, the illumination devices 20 all interconnected with the wiring harnesses 30 and a power source 16, such as a wall outlet, AC adapter (not shown), or the illumination device 20 of an adjacent such mounting device 10 through which power is delivered. The illumination device 20 may include a rigid circuit board in the preferred embodiment, or may include a flexible or resilient circuit board. The wiring harness 30 may be a simple as a single electrical wire with or without a connector, or a plurality of electrical wires with or without one or more connectors, or even a single wire.

A substantially flat platform 40 includes a front side 42, a rear side 48, and three or more peripheral edges 45. The platform 40 has a plurality of apertures 60 therethrough for mounting the illumination devices 20 thereto with mechanical fasteners, such as plastic clips, mechanical fasteners 90, adhesive, or the like. The apertures 60 (FIG. 3) also allow the wiring harnesses 30 to connect between adjacent illumination devices 20, and to traverse from the rear side 48 of the platform 40 to the front side 42 of the platform 40.

Two or more standoffs 80 are each formed, preferably, at the peripheral edges 45 of the platform 40. In embodiments wherein the platform 40 is made from a flat metallic sheet material 50, the standoffs 80 may each be formed from the flat metallic sheet material 50 and bent substantially 90-degrees twice to form a standoff leg 81 and a standoff foot 82. The front side 42 of the sheet material 50, when bent twice, becomes a rear side 83 of the standoff foot 82, which is adapted for contacting and mounting to the mounting surface 15. In embodiments wherein the flat platform 40 is made from a molded plastic material, the standoffs 80 are preferably integrally formed with the platform 40. Separate standoffs 80 may also be used. The platform 40 may also be made from a cast metal or plastic process, in which case the standoffs 80 may also be integrally formed with the platform 40.

The standoffs 80 form a gap or channel 44 (FIG. 7) between the mounting surface 15 and the rear side 22 of each illumination device 20. As such, heat 110 from the illumination devices 20 is able to travel upwardly behind the rear side 48 of the platform 40 to exit at a top of an illumination device 20 display, such as near a ceiling (not shown). In the case wherein the platform 40 is made of the flat metallic sheet material 50, the platform 40 further acts to dissipate heat 110 (FIG. 7) from the illumination devices 20 and throughout the platform 40, acting as a heat sink. The illumination devices 20 at least partially contact the platform 40, but even through convection the platform 40 acts as a heat sink. In the case wherein the platform 40 is made from a common plastic material, unless impregnated with metal or thermally conductive material, the heat sink effectiveness will be lower than that of a platform 40 made of a metallic material. Nevertheless, the illumination devices 20 cool through convection via the channel 42 formed between the mounting surface 15 and the illumination device 20, which provides an effective cooling means for the illumination device 20 regardless of the material used for the platform 40.

Figure 12:
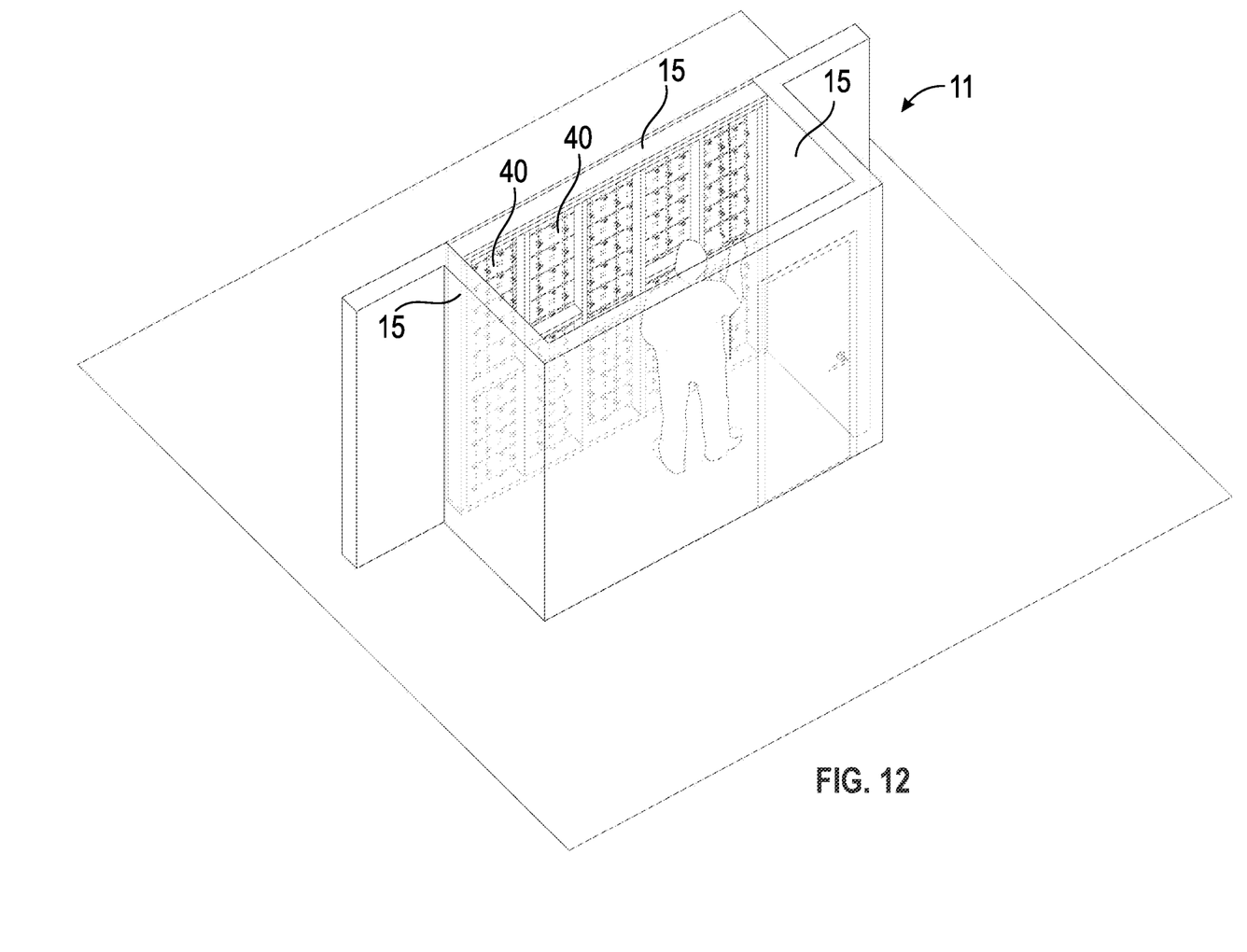
FIG. 12 is a rear perspective view of an installation of the lighting system between two wall surfaces, leaving the rear of the illumination devices accessible for repair or maintenance.

Neighboring mounting devices 10 may be mechanically affixed together, preferably at lateral mounting apertures 86 formed in each standoffs 80, with mechanical fasteners such as screws 85 (FIG. 4) or other fastening devices as are known in the art. In this way the array of the mounting devices 10 and illumination devices 20 can span a gap between at least two wall surface 15 (FIGS. 3 and 12), which allows access to each illumination device 20 for repair or maintenance from behind, as illustrated in FIG. 12.

Figure 1:
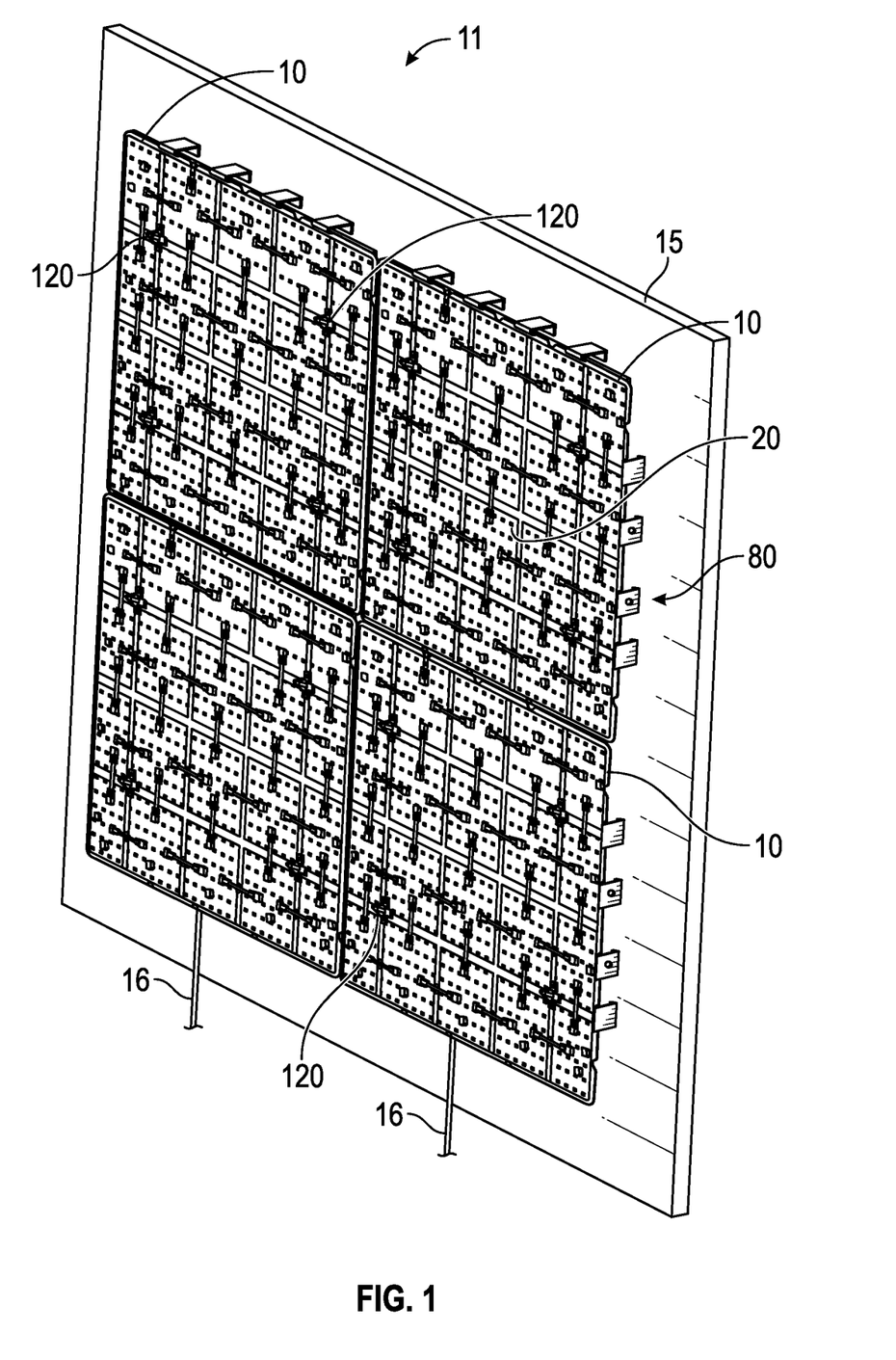
FIG. 1 is a front perspective view of a four-panel mounting device, illustrated with illumination devices interconnected on front sides of the panels with wiring harnesses and mounted to the device which is itself mounted to a mounting surface.
Figure 2:
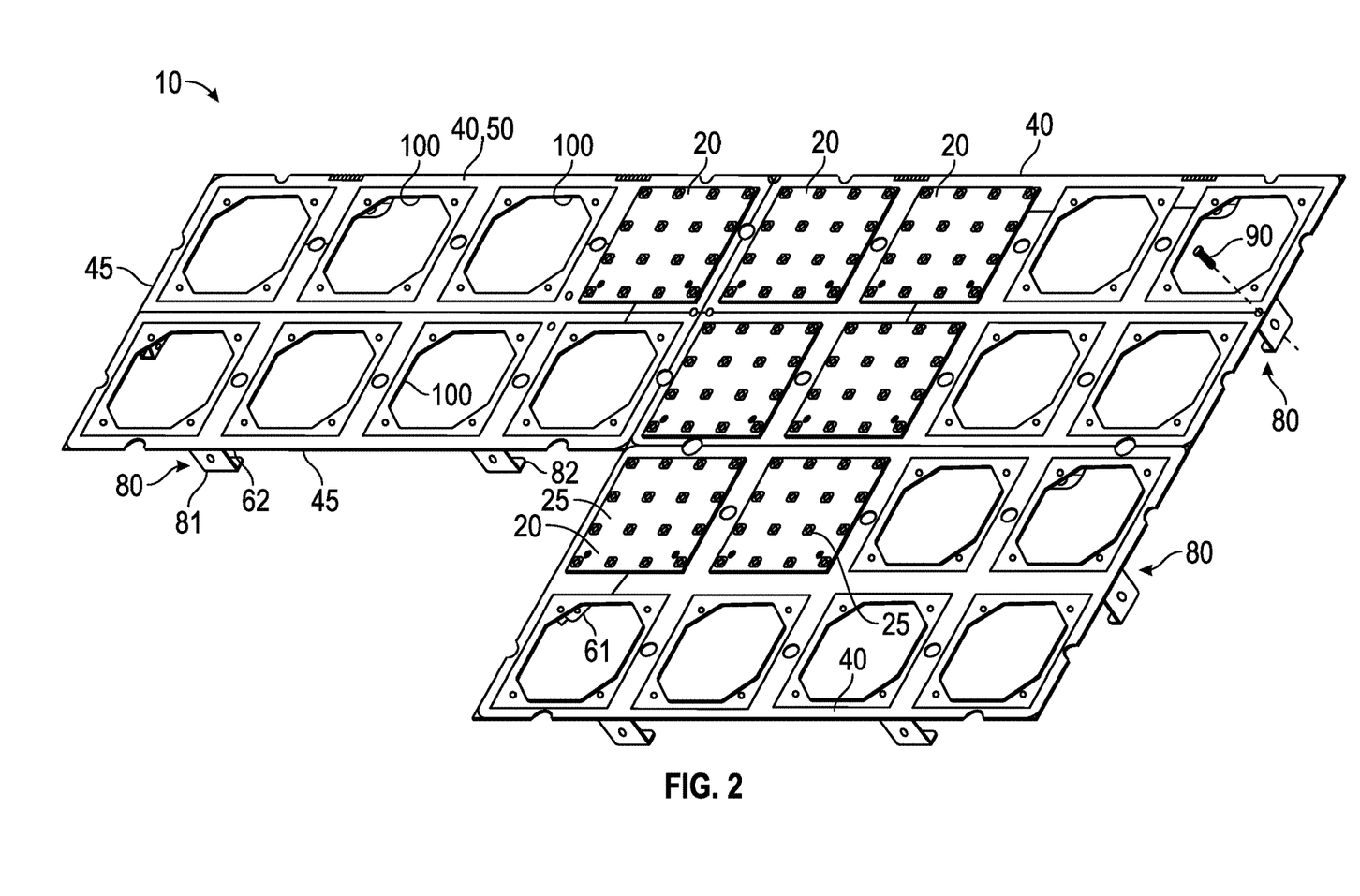
FIG. 2 is a front perspective view of three eight-panel mounting devices fixed together, illustrated with seven illumination devices mounted thereto.
Figure 3:
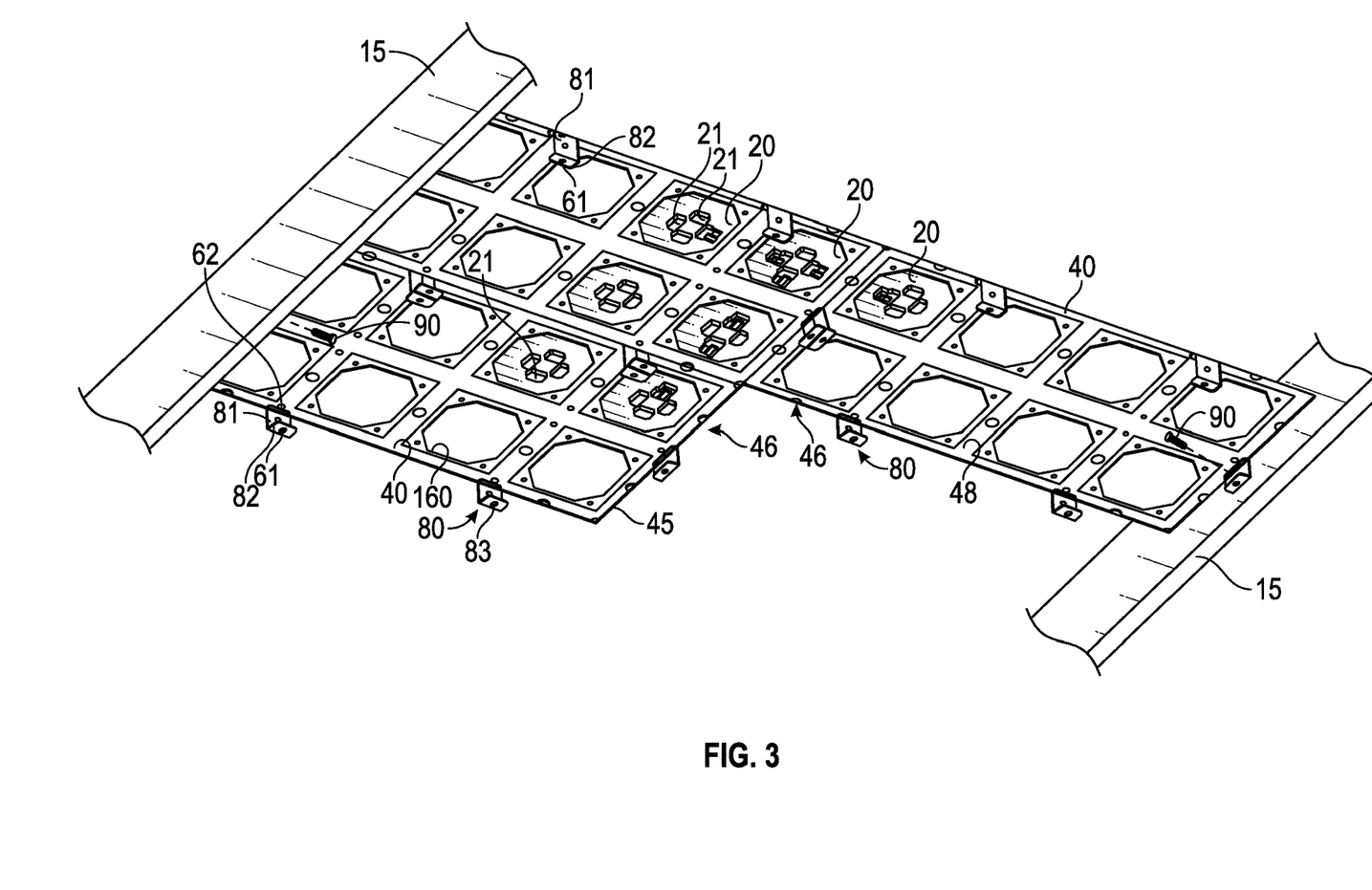
FIG. 3 is a rear perspective view thereof, illustrated without the wire harness for clarity of illustration.
Figure 4:
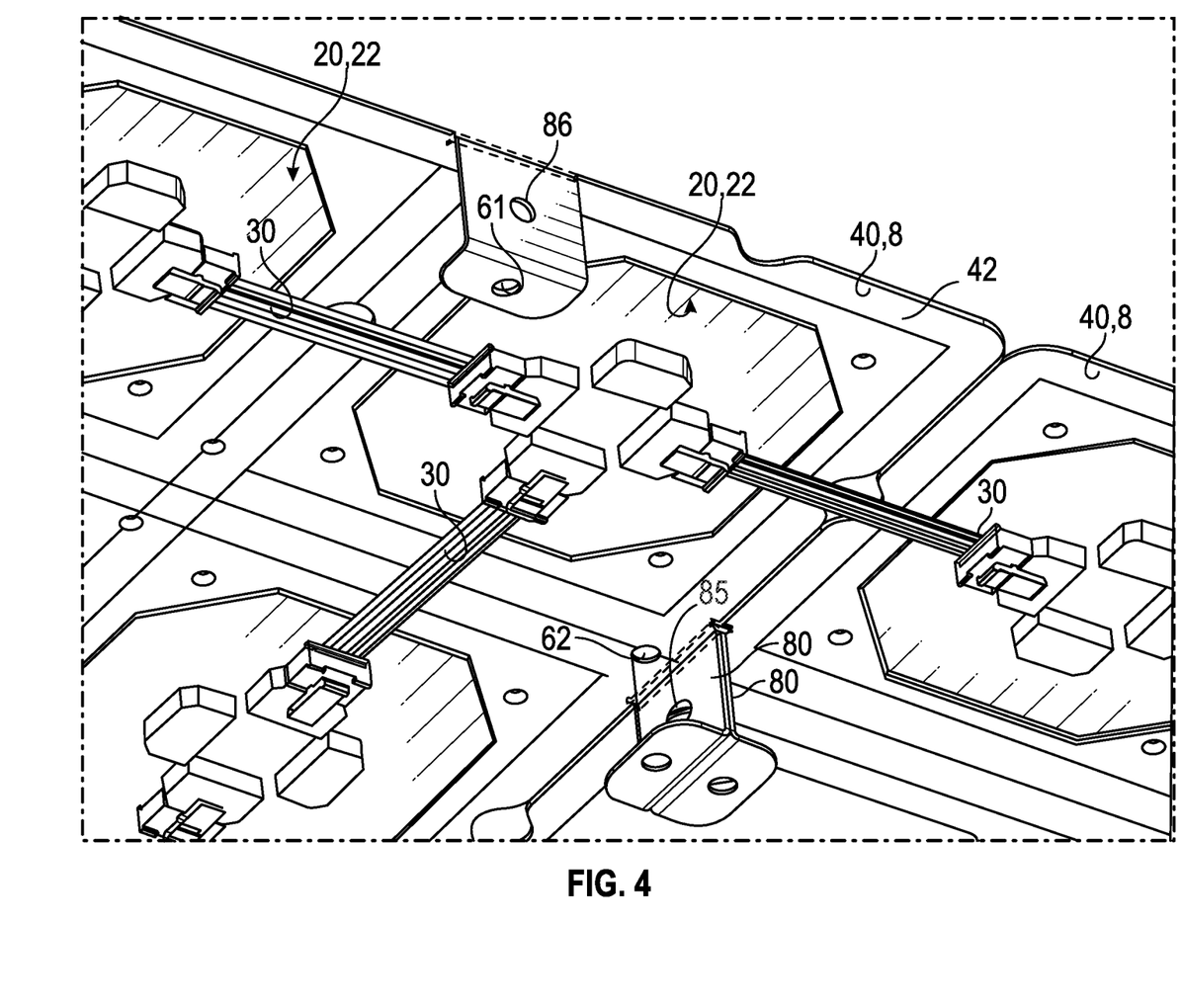
FIG. 4 is a partial, enlarged rear perspective view thereof, illustrated with the wire harnesses mounted on a rear side of the panels.
Figure 7:
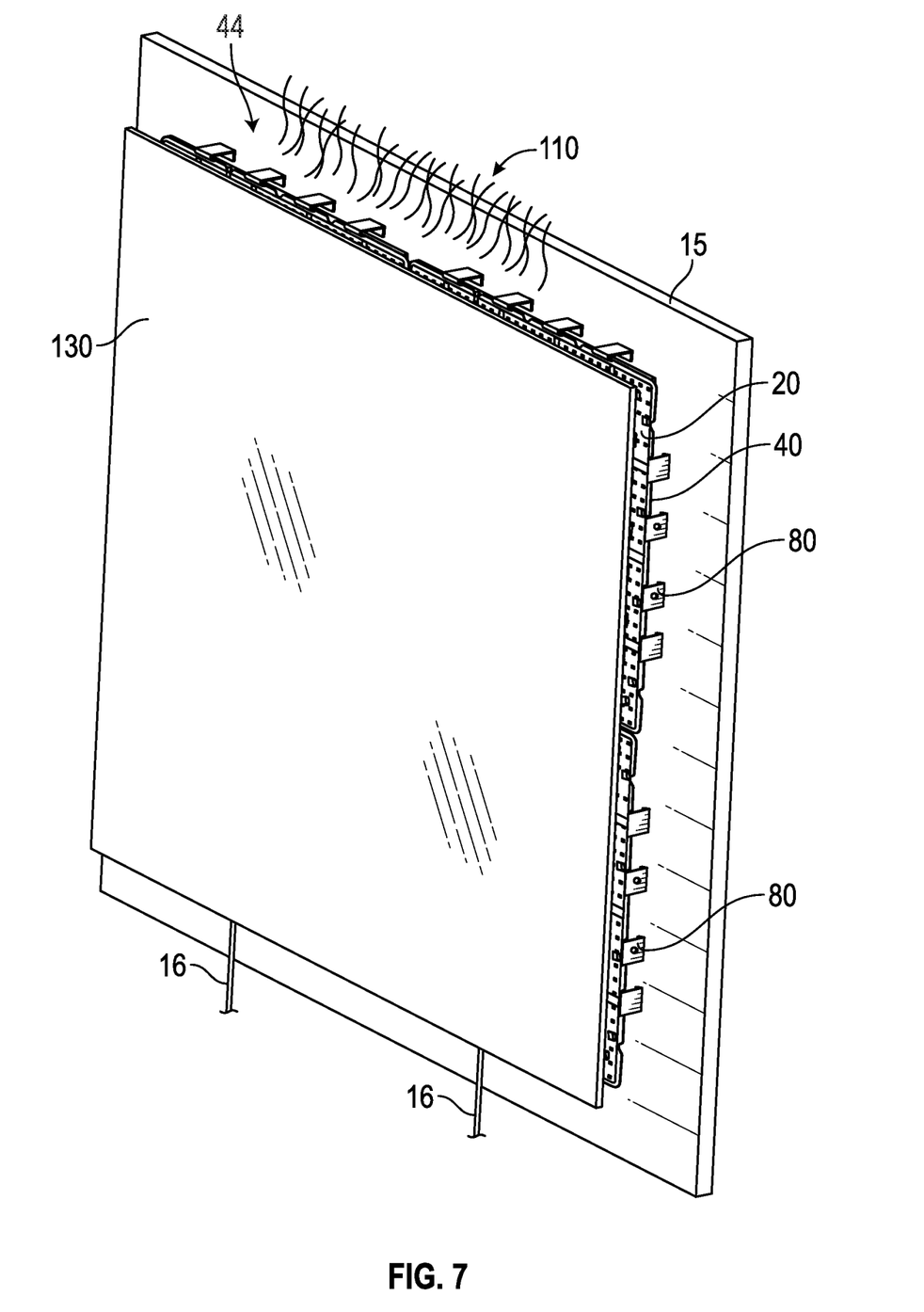
FIG. 7 is a front perspective view of FIG. 6 further including a diffusion material mounted in front of the illumination devices.

The standoff foot 82 includes a mounting aperture 61 therethrough that is aligned with a corresponding larger tool apertures 62 formed in the flat platform 40 proximate the standoff 80. A mechanical fastener 90, such as a drywall screw or the like, traverses the tool aperture 62 of each standoff foot 82 to traverse the mounting aperture 61 with which the tool aperture 62 is aligned. When the standoff foot 82 is brought into contact with the mounting surface 15, the mechanical fastener 90 is inserted through the tool aperture 62 and through the mounting aperture 61 to screw the mounting device 10 to the mounting surface 15 (FIGS. 1 and 7).

Figure 8:
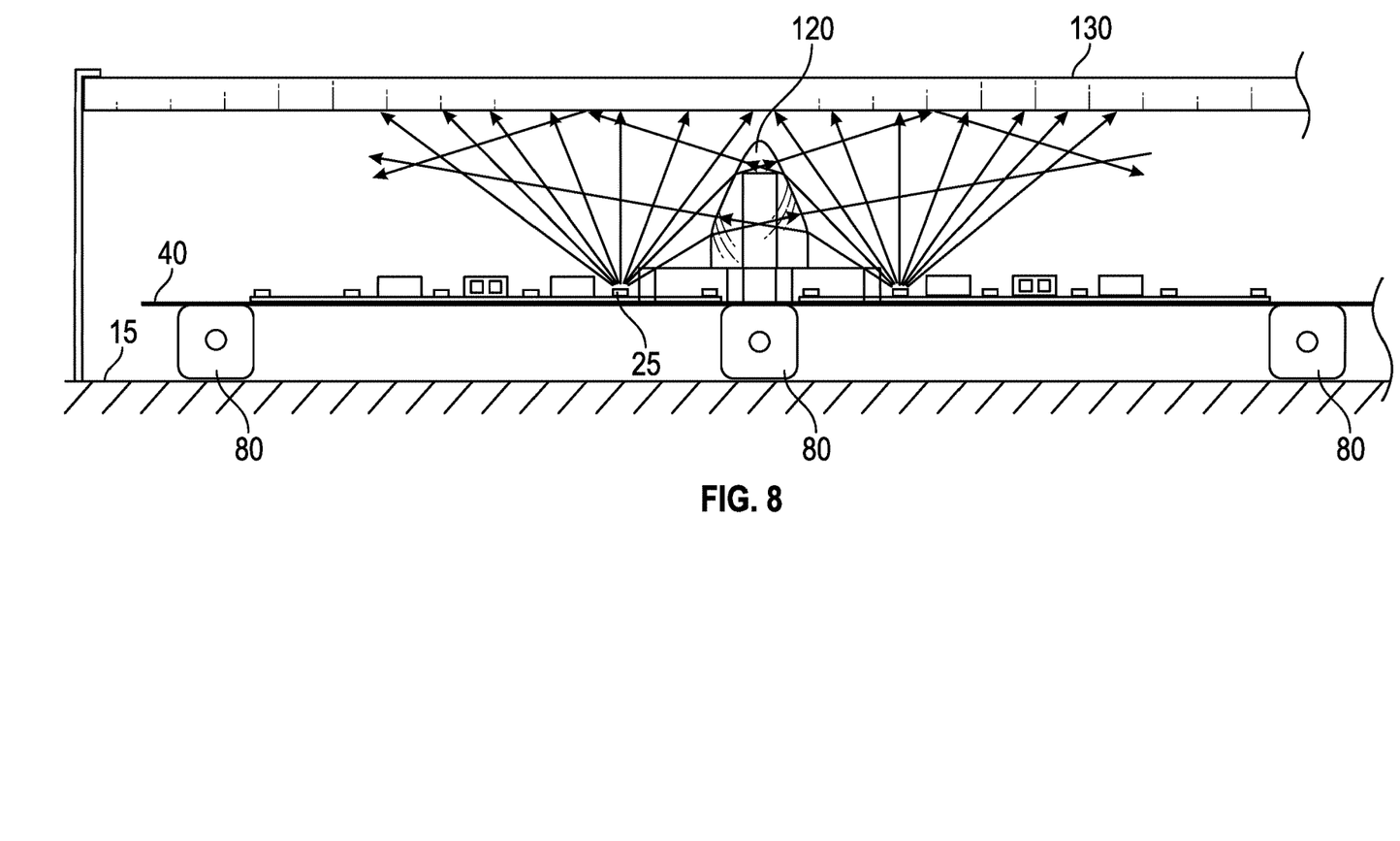
FIG. 8 is a partial top plan view of the invention showing light emanating from LEDs of the illumination device and refracting and/or diffracting through a front standoff.

The lighting system 11 includes a plurality of front standoffs 120 (FIGS. 6 and 8) each projecting forward of the platforms 40. A diffusion material 130, such as a frosted acrylic panel, is disposed in front of the front standoffs 120 to diffuse the light from the illumination devices. Each front standoff 120 is optically formed so to refract and/or diffract light through and around the front standoff 120 (FIG. 8) to reduce shadows of the front standoff 120 on the diffusion material 130. The diffusion material 130 may be fixed to the mounting surface 15 separately from the platforms 40, or fixed with the platforms 40 with separate standoff fasteners (not shown). In some embodiments the diffusion material 130 may be fixed to the front standoffs 120, although some shadows on the diffusion material 130 may result in such an embodiment.

As such, the illumination devices 20 are mounted to the platform 40 with the mechanical fasteners and the wiring harnesses 30 are used to connect each illumination device 20 to at least one other illumination device 20 and/or the power source 16, the platform 40 is mounted to the mounting surface 15 with the mechanical fasteners 90 at each standoff foot 82. Typically neighboring platforms 40 are mounted with uniform spacing, but in some installations, it may be desired that the platforms 40 are mounted to the mounting surface 15 with non-uniform spacing, depending on the aesthetics to be achieved.

In some embodiments, illustrated in FIGS. 1-4, the platform 40 is adapted to connect each illumination device 20 with the wiring harnesses 30 at the rear side 48 of the platform 40. As such, for each illumination device 20 at least one of the apertures 60 is designated a connector aperture 100 and sized to receive therethrough one or more connectors 21 of the illumination devices 20. In the case where the connectors 21 of the illumination devices 20 are offset and parallel with a rear side 22 of the illumination devices 20, the connector aperture 100 is sized to allow the connectors 21 of the illumination devices 20 to clear the connector aperture 100 to allowing the wiring harnesses 30 to be connected with the connectors 21 of the illumination devices 20.

Figure 5:
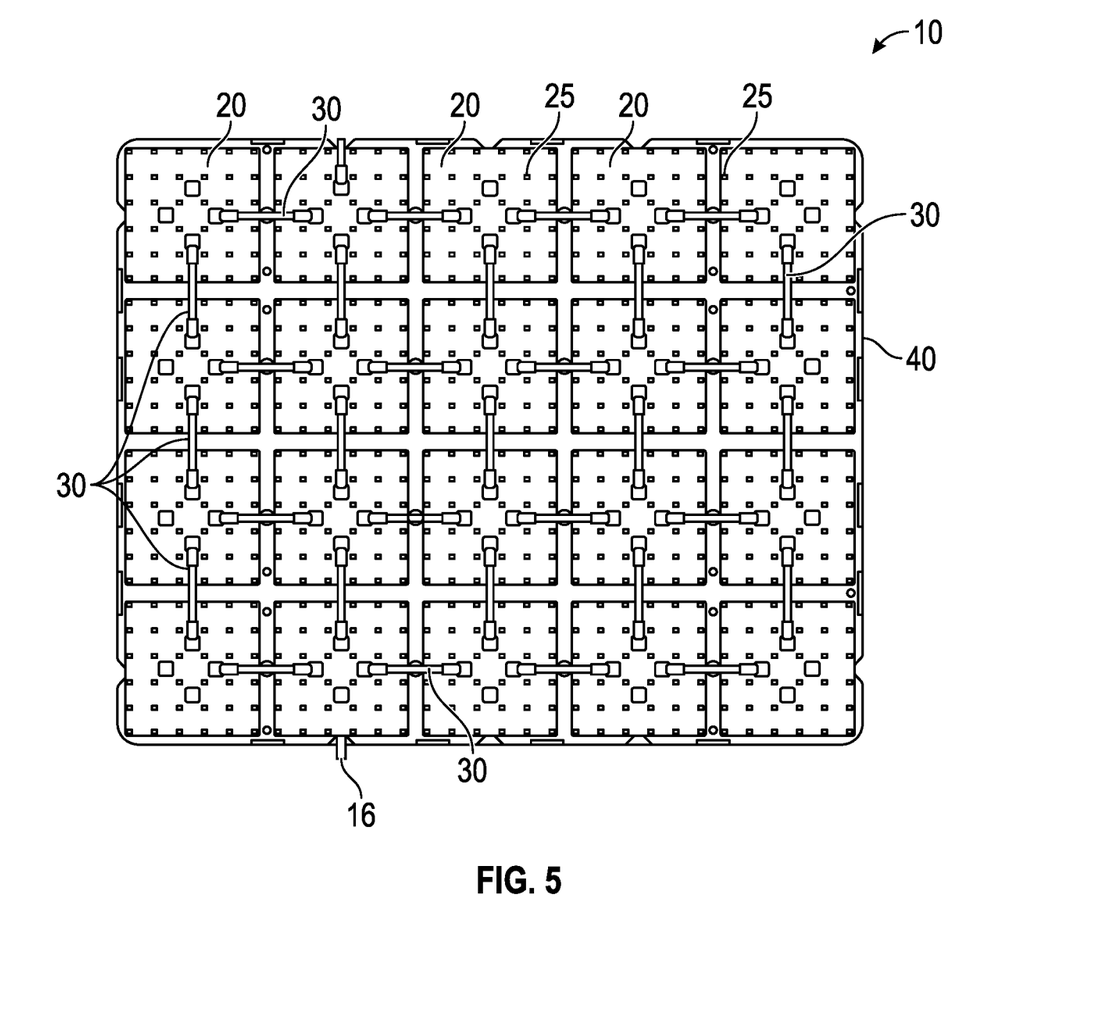
FIG. 5 is a front elevational view of one embodiment thereof.
Figure 6:
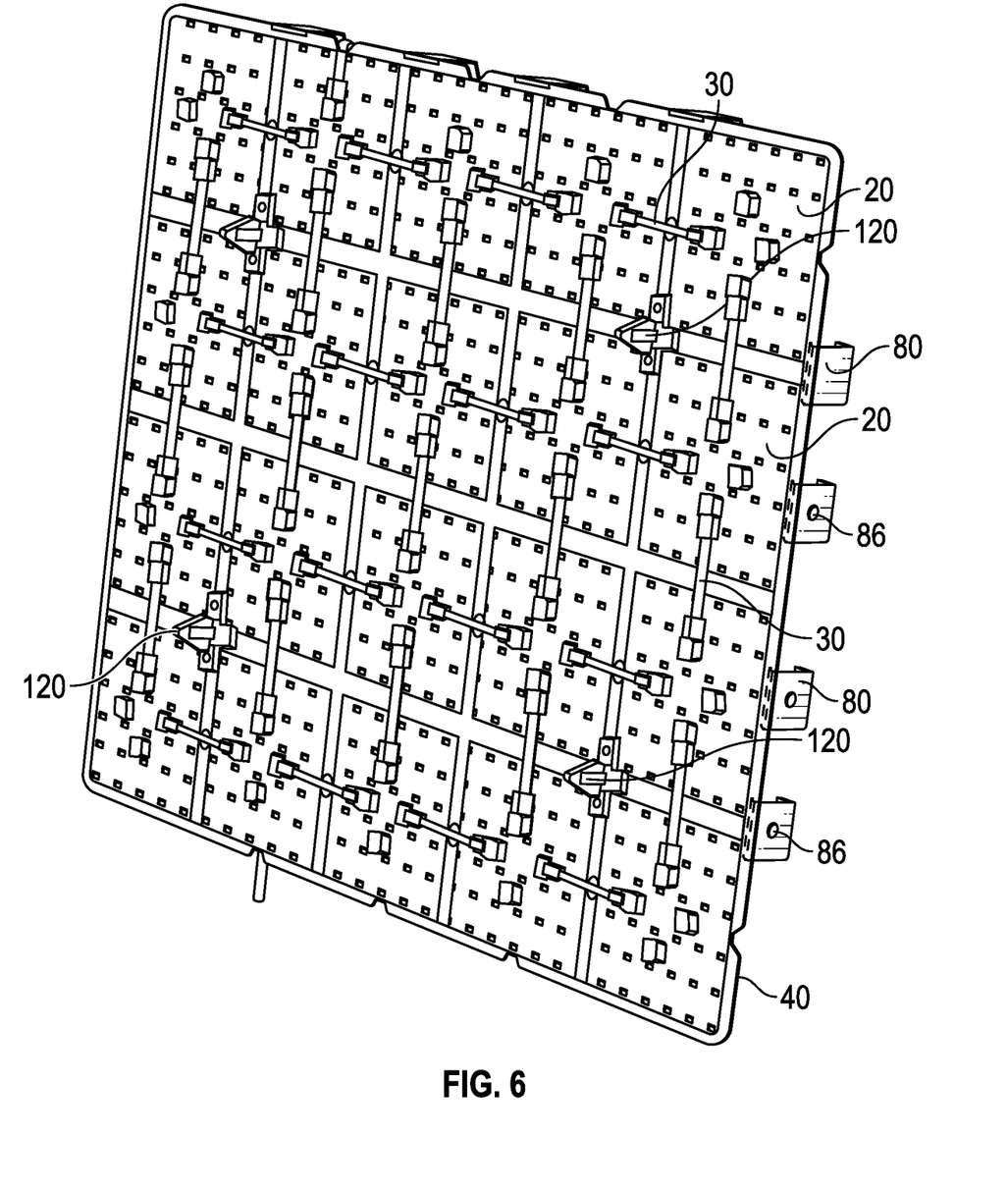
FIG. 6 is a front perspective view of a twenty-panel mounting device, illustrated with the inter-connecting wiring harnesses mounted at the front side of the mounting device and in front of twenty illumination devices.

In alternate embodiments, illustrated in FIGS. 5-7, the platform 40 is adapted to connect each illumination device 20 with the wiring harnesses 30 at the front side 42 of the platform 40.

In some embodiments at least one of the peripheral edges 45 of the platforms 40 includes a shaped edge 46 to engage or otherwise cooperate with an adjacent such platform 40, to provide for uniform spacing the platforms 40 in an array of platforms 40, thereby resulting in uniform spacing of an array of the illumination devices 20.

Figure 9:
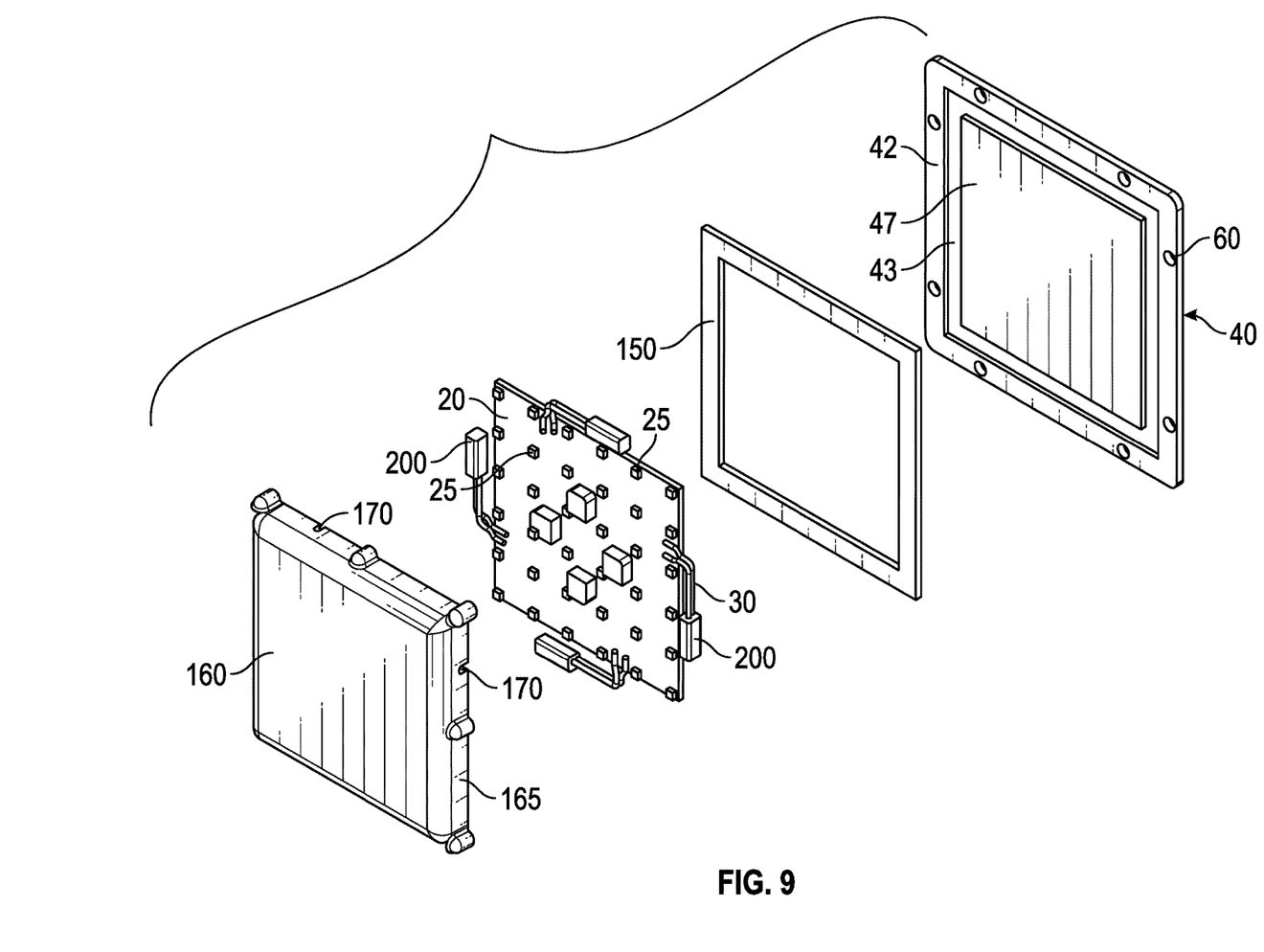
FIG. 9 is an exploded perspective view of an embodiment for use in wet environments, comprising a non-opaque lens fixed over the illumination device and to a gasket and the flat platform to provide a water tight seal.
Figure 10:
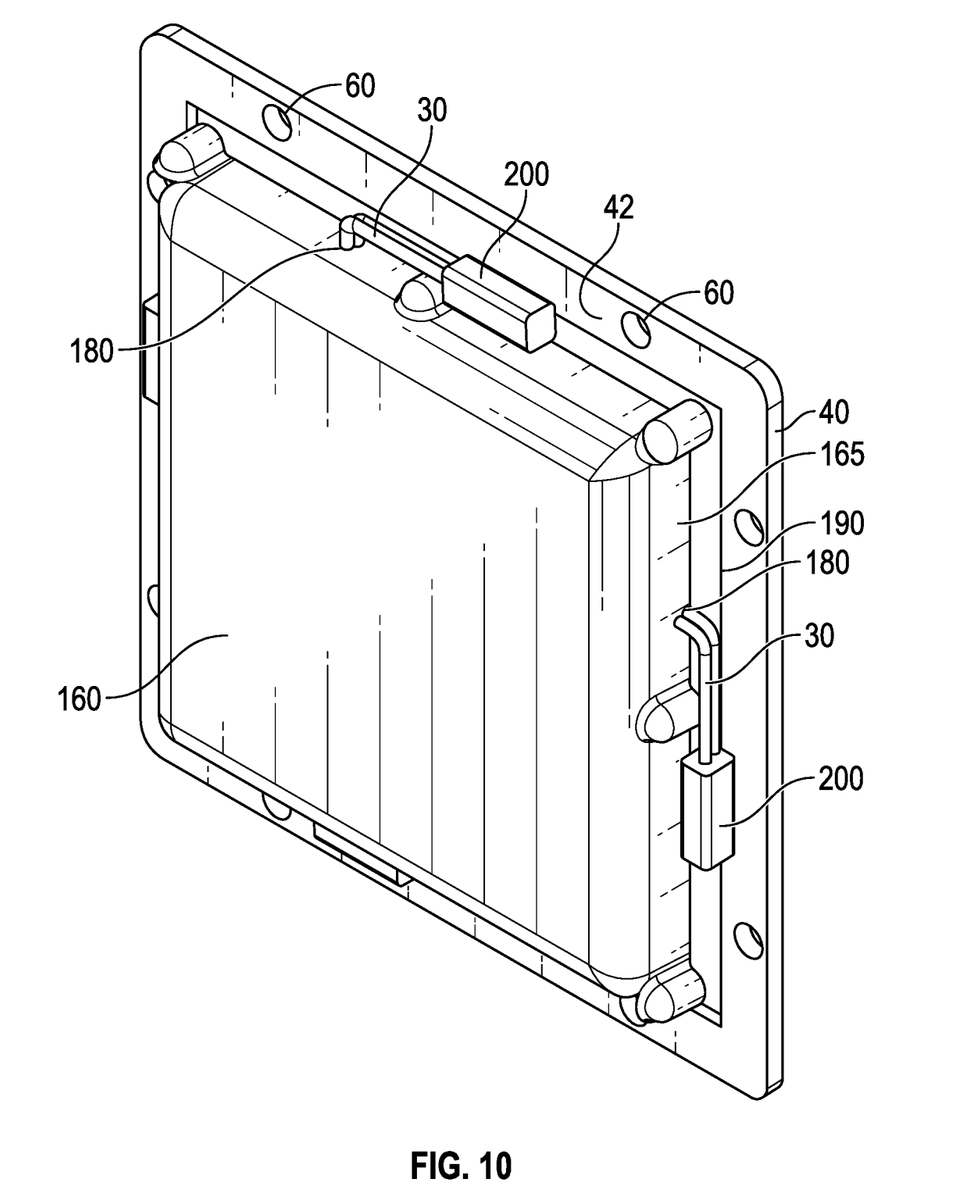
FIG. 10 is a non-exploded perspective view of the embodiment of FIG. 9.
Figure 11:
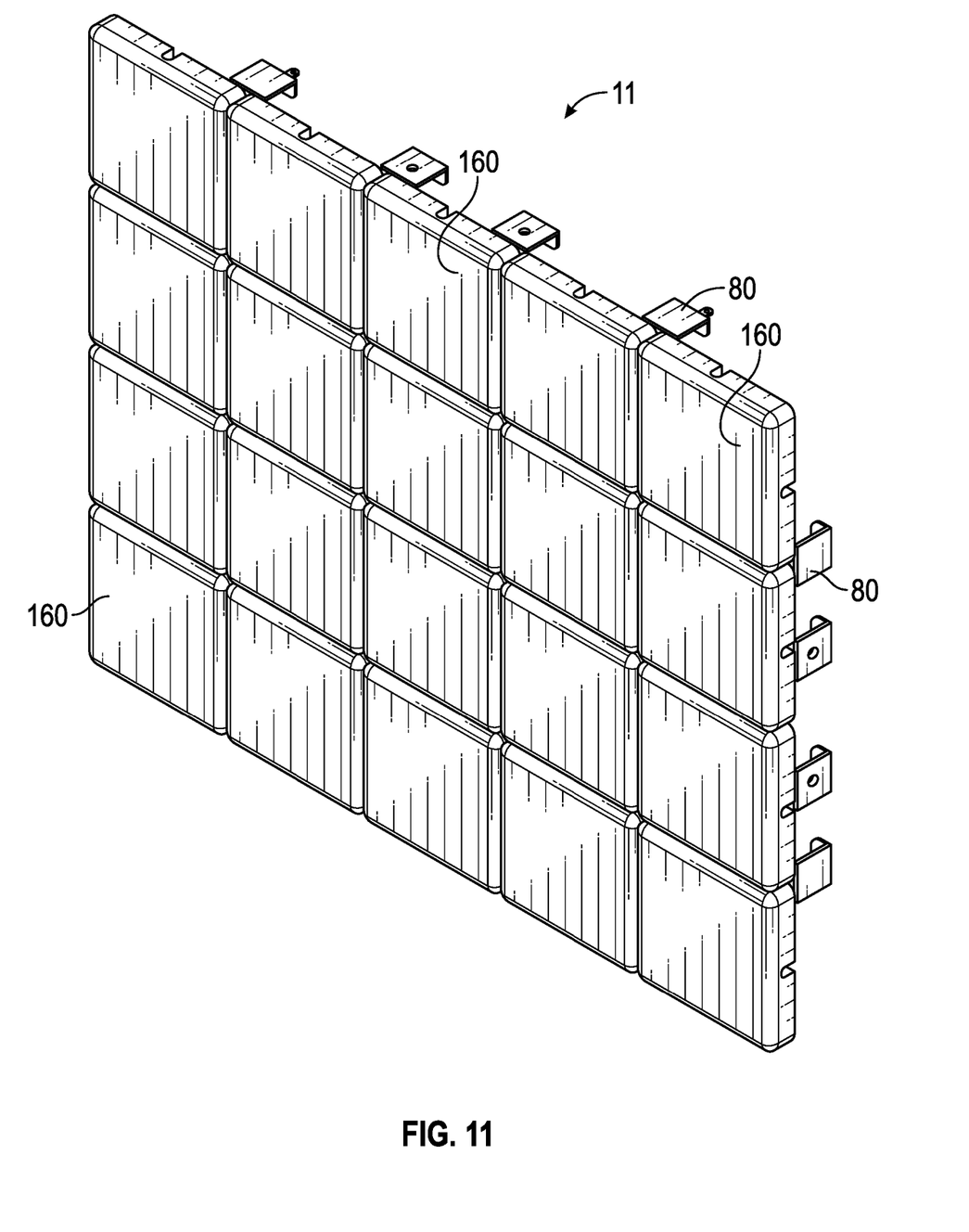
FIG. 11 is a perspective view of a plurality of the embodiments of FIG. 9.

In some embodiments adapted for humid or wet environments, the front side 42 of the flat platform 40 preferably includes a gasket recess 43 (FIG. 9) defining an internal area 47 of the front side 42 of the flat platform 40 that is devoid of the apertures 60. A gasket 150 is configured for retainment within the gasket recess 43 of the flat platform 40, or just to contact the front side 42 of the flat platform 40 if there is no gasket recess 43 therein. A non-opaque lens 160 has an open rear end configured for receiving the illumination device 20 therein and for mounting to the gasket 150 and the flat platform 40 with the mechanical fasteners 90. Preferably side edges 165 of the non-opaque lens 160 have one or more ports 170 through which the wiring harness 30 traverses to form a liquid tight seal 180 (FIG. 10). Alternately the one or more ports 170 are formed through the flat platform 40 to form the liquid tight seal 180 (not shown). The non-opaque lens 160, the gasket 150, and the platform 40 form a second liquid tight seal 190. The wiring harnesses 30 of two adjacent illumination devices 20, in such embodiments, are connected at a third water tight seal 200, as is known in the art. As such, water is inhibited from contacting any conductors of the wiring harness 30 or of the illumination device 20. The non-opaque lens 160 is preferably made with a rigid transparent plastic such as acrylic or polycarbonate. The gasket 150 is preferably made with a water-impervious elastomeric, felt, or cork material.

While a particular form of the invention has been illustrated and described, it will be apparent that various modifications can be made without departing from the spirit and scope of the invention. Accordingly, it is not intended that the invention be limited, except as by the appended claims.

Particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms.

Accordingly, the actual scope of the invention encompasses not only the disclosed embodiments, but also all equivalent ways of practicing or implementing the invention.

The above detailed description of the embodiments of the invention is not intended to be exhaustive or to limit the invention to the precise form disclosed above or to the particular field of usage mentioned in this disclosure. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated.

While certain aspects of the invention are presented below in certain claim forms, the inventor contemplates the various aspects of the invention in any number of claim forms. Accordingly, the inventor reserves the right to add additional claims after filing the application to pursue such additional claim forms for other aspects of the invention.

What is claimed is:

1. A lighting system for mounting on a mounting surface comprising:
    a mounting device for fixing with the mounting surface;
    a plurality of illumination devices;
    a plurality of electrical connectors on each of the plurality of illumination devices;
    a plurality of front standoffs extending from a front surface of the mounting device, a diffusion material disposed in front of the front standoffs, each front standoff being optically formed to refract and/or diffract light through and around the front standoff to reduce shadows of the front standoff onto the diffusion material; and
    a plurality of wiring harnesses for connecting each of the plurality of illumination devices to each adjacent one of the plurality of illumination devices or with a power source;
    the mounting device comprising:
        a substantially flat platform made having a front side, a rear side, and three or more peripheral edges, the platform having a plurality of apertures therethrough for mounting respective ones of the plurality of illumination devices thereto with mechanical fasteners and for allowing the wiring harnesses to connect between adjacent illumination devices; and
        two or more standoffs each affixed between the flat platform and the mounting surface, each of the two or more standoffs having a standoff leg and a standoff foot, the standoff leg having a proximal end attached to and extending from the flat platform, the standoff foot extending from a distal end of the standoff leg, the standoff foot being coplanar with the flat platform, the standoff foot extending under the flat platform, the standoff leg providing a separation between the flat platform and the mounting surface when the standoff foot is attached to the mounting surface;
    whereby the illumination devices are mounted to the platform with one or more mechanical fasteners, the wiring harnesses are used to connect each illumination device, and the platform is mounted to the mounting surface with the mechanical fasteners at each standoff foot.

2. The lighting system of claim 1 wherein the flat platform and the standoffs are integrally formed from a flat metallic sheet material and bent substantially 90-degrees twice to form the standoff leg and the standoff foot, the front side of the sheet material when bent twice becoming a rear side of the standoff foot and adapted for contacting the mounting surface, the standoff foot having a mounting aperture therethrough that is aligned with a corresponding larger tool aperture formed in the flat platform proximate the standoff, the mounting device further including a mechanical fastener for each standoff adapted to traverse the tool aperture of each foot to traverse the mounting aperture and the mounting surface.

3. The lighting system of claim 2 wherein two or more of the mounting devices may be mechanically affixed together with lateral mounting apertures formed in each standoff, with mechanical fasteners, such that an array of the mounting devices and illumination devices can span a gap between at least two opposing of the mounting surfaces.

4. The lighting system of claim 1 wherein the platform is adapted to connect each of the plurality of illumination devices with the respective ones of the plurality of wiring harnesses at the rear side of the platform.

5. The lighting system of claim 4 wherein a connector aperture of the apertures for each of the plurality of illumination devices is sized to receive therethrough the plurality of electrical connectors of the illumination devices.

6. The lighting system of claim 5 wherein, in the case where each of the plurality of connectors of each of the plurality of illumination devices are offset and parallel with a rear side of the respective illumination devices, the connector aperture is sized to allow each of the plurality of connectors of each of the plurality of illumination devices to clear the connector aperture to allow each of the plurality of wiring harnesses to be connected with the respective connectors of each of the plurality of illumination devices.

7. The lighting system of claim 1 wherein at least one of the peripheral edges of the platform is shaped to engage an adjacent such platform to provide for uniform spacing of the platforms in an array of platforms, thereby resulting in a uniform spacing of an array of the illumination devices from the mounting device to an adjacent such mounting device.

8. The lighting system of claim 1 wherein the front side of the flat platform includes a gasket recess defining an internal area, the internal area devoid of the apertures, and further including a gasket configured for retainment within the gasket recess of the flat platform, and a non-opaque lens having an open rear end configured for receiving the illumination device therein and for mounting to the gasket and the flat platform, side edges of the non-opaque lens having one or more ports through which the wiring harness traverses to form a liquid tight seal, the non-opaque lens, gasket, and platform forming a second liquid tight seal.

9. The lighting system of claim 8 wherein the non-opaque lens is fixed to the gasket and the flat platform with a plurality of mechanical fasteners.

10. The lighting system of claim 8 wherein with two of the wiring harnesses mutually connected, a third water tight seal is formed.

11. A lighting system for mounting on a mounting surface, comprising:
   a mounting device for fixing with the mounting surface;
   a plurality of illumination devices;
   a plurality of front standoffs each extending from a front surface of one of the illumination devices, a diffusion material disposed in front of the front standoffs, each front standoff being optically formed to refract and/or diffract light through and around the front standoff to reduce shadows of the front standoff onto the diffusion material;
   a plurality of electrical connectors on each of the plurality of illumination devices; and
   a plurality of wiring harnesses connecting each of the plurality of illumination devices to each adjacent one of the plurality of illumination devices or with a power source, the mounting device comprising:
      a substantially flat platform made from a flat plastic sheet material having a front side, a rear side, and three or more peripheral edges, the platform having a plurality of apertures therethrough for mounting each of the plurality of illumination devices thereto with mechanical fasteners and for allowing each of the plurality of wiring harnesses to connect between adjacent illumination devices;
      one or more standoffs each formed from the plastic material and oriented substantially 90-degrees from the platform to form a standoff leg, and oriented parallel to the platform to form a standoff foot, the standoff foot adapted for contacting the mounting surface and having a mounting aperture therethrough that is aligned with a corresponding larger tool aperture formed in the flat platform proximate the standoff, the standoff leg providing a separation between the flat platform and the mounting surface when the standoff foot is attached to the mounting surface;
      a mechanical fastener for each standoff adapted to traverse the tool aperture of each foot to traverse the mounting aperture and the mounting surface;
   whereby each of the plurality of illumination devices are mounted to the platform with the mechanical fasteners, each of the plurality of wiring harnesses are used to connect each of the plurality of illumination devices, and the platform is mounted to the mounting surface with the mechanical fasteners at each standoff foot.

12. The lighting system of claim 11 wherein the platform is adapted to connect each illumination device with the wiring harnesses at the rear side of the platform.

13. The lighting system of claim 12 wherein a connector aperture of the apertures for each of the plurality of illumination devices is sized to receive therethrough the plurality of electrical connectors of each of the plurality of illumination devices.

14. The lighting system of claim 13 wherein, in the case where the plurality of electrical connectors of each of the plurality of illumination devices are offset and parallel with a rear side of each of the plurality of illumination devices, the connector aperture is sized to allow each of the plurality of connectors of the respective illumination devices to clear the connector aperture to allow the plurality of wiring harnesses to be connected with the plurality of connectors of the respective illumination devices.

15. The lighting system of claim 11 wherein at least one of the peripheral edges of the platform is shaped to engage an adjacent such platform to provide for uniform spacing of the platforms in an array of platforms, thereby resulting in a uniform spacing of an array of the plurality of illumination devices.

16. The lighting system of claim 11 wherein the front side of the flat platform includes a gasket recess defining an internal area, the internal area devoid of the apertures, and further including a gasket configured for retainment within the gasket recess of the flat platform, and a non-opaque lens having an open rear end configured for receiving the illumination device therein and for mounting to the gasket and the flat platform, side edges of the non-opaque lens having one or more ports through which the wiring harness traverses to form a liquid tight seal, the non-opaque lens, gasket, and platform forming a second liquid tight seal.

17. The lighting system of claim 16 wherein the non-opaque lens is fixed to the gasket and the flat platform with a plurality of mechanical fasteners.

18. The lighting system of claim 16 wherein with two of the wiring harnesses mutually connected, a third water tight seal is formed.

* * * * *